(12) United States Patent
Aharony et al.

(10) Patent No.: US 8,995,573 B1
(45) Date of Patent: Mar. 31, 2015

(54) OCTAGONAL QUADRATURE AMPLITUDE MODULATION

(71) Applicant: Dragonwave, Inc., Kanata (CA)

(72) Inventors: Ahikam Aharony, Kanata (CA); Chunyao Li, Kanata (CA); Mikhail Prokoptsov, Kanata (CA)

(73) Assignee: Dragonwave, Inc., Kanata (CA)

( * ) Notice: Subject to any disclaimer, the term of this patent is extended or adjusted under 35 U.S.C. 154(b) by 77 days.

(21) Appl. No.: 13/658,566

(22) Filed: Oct. 23, 2012

(51) Int. Cl.
 *H04L 27/36* (2006.01)
 *H04L 27/04* (2006.01)
 *H03C 5/00* (2006.01)

(52) U.S. Cl.
 CPC . *H04L 27/04* (2013.01); *H03C 5/00* (2013.01)
 USPC .................................................. 375/298

(58) Field of Classification Search
 CPC .............................. H04L 27/34; H04L 27/362
 USPC ............... 375/298, 224, 227, 260; 455/456.1
 See application file for complete search history.

(56) References Cited

U.S. PATENT DOCUMENTS

| | | | |
|---|---|---|---|
| 5,828,695 A | 10/1998 | Webb | |
| 5,832,041 A | 11/1998 | Hulyalkar | |
| 6,005,897 A | 12/1999 | McCallister et al. | |
| 6,567,477 B1 | 5/2003 | Feldman et al. | |
| 6,996,189 B1 | 2/2006 | Morejon et al. | |
| 7,006,578 B2 | 2/2006 | Walker et al. | |
| 7,039,126 B2 | 5/2006 | Galins | |
| 7,068,990 B1 | 6/2006 | Herbig | |
| 7,505,788 B1 | 3/2009 | Narasimhan | |
| 7,889,804 B2 | 2/2011 | Borran et al. | |
| 7,961,025 B2 | 6/2011 | Rylov | |
| 2002/0051501 A1 | 5/2002 | Demjanenko et al. | |
| 2006/0085727 A1 | 4/2006 | Azenkot et al. | |
| 2008/0170636 A1 | 7/2008 | Han | |
| 2010/0150577 A1 | 6/2010 | Essiambre et al. | |
| 2011/0038406 A1* | 2/2011 | Pfletschinger | 375/227 |

(Continued)

FOREIGN PATENT DOCUMENTS

WO WO-01/24600 A2 4/2001
WO WO-2011/130450 A1 10/2011

OTHER PUBLICATIONS

Collin, "Optimal Minimum Distance Based Precoder for MIMO Spatial Multiplexing Systems", IEEE Transactions on Signal Processing, vol. 52, No. 3, Mar. 2004, pp. 617-627, downloaded from http://www.univ-brest.fr/lest/tst/publications/pdf/0403IeeeSpDmin.pdf on Oct. 22, 2012.

(Continued)

*Primary Examiner* — Khai Tran
(74) *Attorney, Agent, or Firm* — Marshall, Gerstein & Borun LLP

(57) ABSTRACT

Octagonal non-rectangular Quadrature Amplitude Modulation (QAM) is disclosed. Grid points from a uniform rectangular grid, which includes points that have equal horizontal and vertical spacing, are selected to form a non-rectangular octagonal grid that approximates an octagonal shape. QAM symbols are mapped to respective grid points in the non-rectangular octagonal grid to form a non-rectangular octagonal QAM constellation that also approximates the octagonal shape. Input signals can then be modulated using the non-rectangular octagonal QAM constellation.

17 Claims, 6 Drawing Sheets

(56) References Cited

U.S. PATENT DOCUMENTS

2011/0090948 A1    4/2011  Zhou et al.
2011/0134981 A1*   6/2011  Garth et al. ............... 375/224

OTHER PUBLICATIONS

Haider, "Peak to Average Ratio Reduction in Wireless OFDM Communication Systems", Blekinge Institute of Technology, Jan. 2006, downloaded from http://www.sea-mist.se/fou/cuppsats.nsf/all/567c42eab36d77cbc125710a00271be2/$file/PAR_reduction_in_OFDM.pdf on Oct. 22, 2012.

Kawai et al., "Optimum Combination of Amplitude and Phase Modulation Scheme and its Application to Data Transmission MODEM", Proceedings of IEEE International Conference of Communications, p. 29.6-29.11, Philadelphia, PA, Jun. 1972.

Krongold et al., "An Active-Set Approach for OFDM PAR Reduction Via Tone Reservation", Oct. 8, 2003, downloaded from http://www.cubinlab.ee.unimelb.edu.au/~bsk/toneres.pdf on Oct. 22, 2012.

Moore et al., "Pairwise Optimization of Modulation Constellations", Queen's University, Aug. 31, 2009, downloaded from http://www.mast.queensu.ca/~web/Papers/pacrim09-po-mod.pdf on Oct. 22, 2012.

Nguyen, "PAR Reduction in OFDM Systems by Multiple Signal Representation", University of Sydney, Apr. 2006.

Shaikhi et al., "Alternative Symbol Representations with Radial Symmetry for PAPR Reduction in OFDM Systems", 2007, downloaded from http://www.prism.uvsq.fr/~jbo/ICC07/DATA/S07S10P06.PDF on Oct. 22, 2012.

Ungerboeck, G., "Channel Coding With Multilevel/Phase Signals", IEEE Transactions on Information Theory, vol. 28, Issue 1, Jan. 1982, pp. 55-67.

* cited by examiner

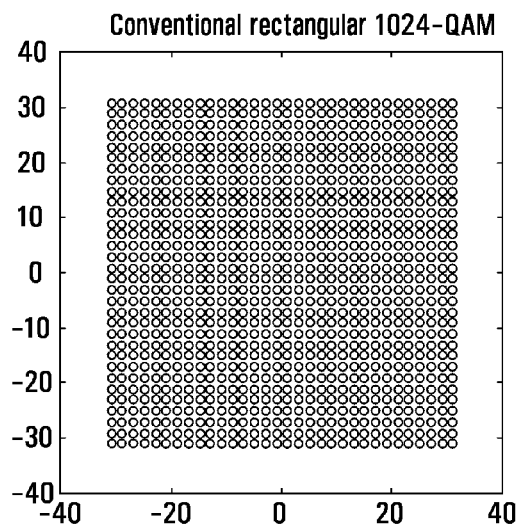
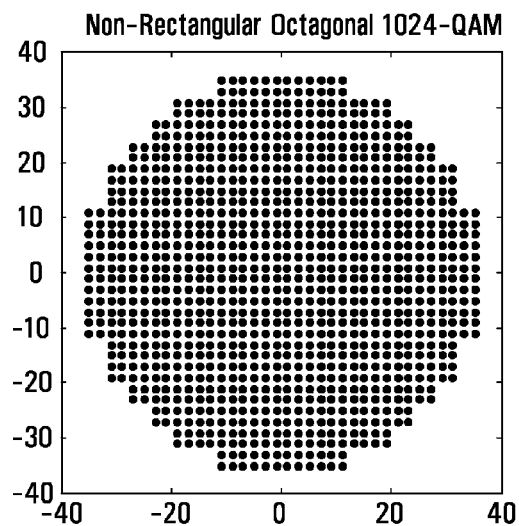
FIG. 1A  FIG. 1B
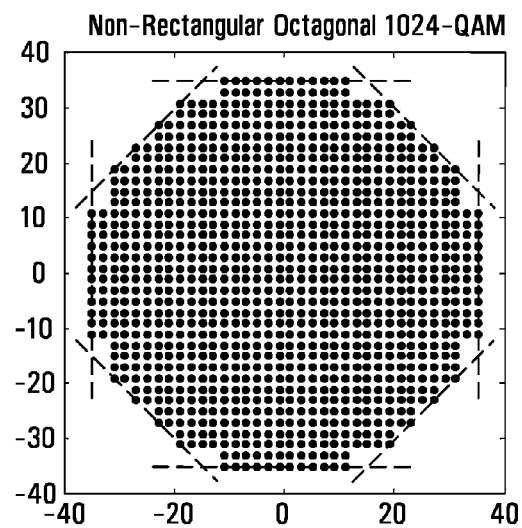
FIG. 1C

OCTAGONAL QUADRATURE AMPLITUDE MODULATION

FIELD OF THE INVENTION

This invention relates generally to modulation and, in particular, to Quadrature Amplitude Modulation (QAM) using non-rectangular constellations that are based on rectangular two-dimensional grids but approximate an octagonal shape.

BACKGROUND

Rectangular QAM, which uses rectangular constellations in which constellation points have equal horizontal and vertical spacing from each other, is becoming increasingly more available in communication systems aimed to deliver more throughput on a given channel with limited spectrum availability. As with many communication applications, Signal to Noise Ratio (SNR) and Peak to Average Power Ratio (PAPR) of the modulation scheme are of a major concern. While other shapes of constellations are possible and could offer better SNR and PAPR than rectangular constellations, the associated modulators and demodulators become substantially more complex.

SUMMARY

According to an aspect of the present disclosure, a method involves selecting, from a uniform rectangular grid comprising points that have equal horizontal and vertical spacing, a subset of the points to form a non-rectangular octagonal grid, the non-rectangular octagonal grid approximating an octagonal shape; and mapping QAM symbols to respective grid points in the non-rectangular octagonal grid to form a non-rectangular octagonal QAM constellation that approximates the octagonal shape.

If the non-rectangular octagonal grid includes N points, with $N=2^n$ and $n \geq 1$, the rectangular grid includes an M-by-M matrix of points, with M a positive integer and $M^2 > N$.

The non-rectangular octagonal QAM constellation could include symbols in k cosets, with $k=2^K$ and $K \geq 1$. The selecting then involves selecting points from the rectangular grid in groups of k adjacent points, and the mapping involves mapping a QAM symbol from each of the k cosets to each group of k points.

In some embodiments, the non-rectangular octagonal grid includes N points, with $N=2^n$ and $n \geq 1$. The selecting could then involve selecting points of the rectangular grid that fall within a circle centered at an origin of the rectangular grid and expanding the circle until N points fall within the circle. In a coset embodiment with k cosets, the selecting involves selecting points of the rectangular grid in groups of k adjacent points that fall within a circle centered at an origin of the rectangular grid and expanding the circle until N/k groups of k points fall within the circle.

The method could also include modulating input signals using the non-rectangular octagonal QAM constellation. The input signals include trellis coded input signals in some embodiments.

A non-transitory computer readable medium storing instructions, which when executed cause such a method to be performed, is also provided.

According to another aspect of the present disclosure, an apparatus includes a grid point selector that selects, from a uniform rectangular grid comprising points that have equal horizontal and vertical spacing, a subset of the points to form a non-rectangular octagonal grid, the non-rectangular octagonal grid approximating an octagonal shape; and a grid point mapper that maps QAM symbols to respective grid points in the non-rectangular octagonal grid to form a non-rectangular octagonal QAM constellation.

As noted above, if the non-rectangular octagonal grid includes N points, with $N=2^n$ and $n \geq 1$, the rectangular grid includes an M-by-M matrix of points, with M a positive integer and $M^2 > N$.

The non-rectangular octagonal QAM constellation could include symbols in k cosets, with $k=2^K$ and $K \geq 1$. The grid point selector then selects points from the rectangular grid in groups of k adjacent points, and the grid point mapper maps a QAM symbol from each of the k cosets to each group of k points.

In some embodiments, the non-rectangular octagonal grid includes N points, with $N=2^n$ and $n \geq 1$. The grid point selector could then select points of the rectangular grid that fall within a circle centered at an origin of the rectangular grid and expand the circle until N points fall within the circle. In a coset embodiment with k cosets, the grid point selector selects points of the rectangular grid in groups of k adjacent points that fall within a circle centered at an origin of the rectangular grid and expands the circle until N/k groups of k points fall within the circle.

The apparatus could also include a modulator, operatively coupled to the grid point mapper, that modulates input signals using the non-rectangular octagonal QAM constellation. In some embodiments, a trellis coder is operatively coupled to the modulator, and generates trellis coded signals as the input signals.

A method according to a further aspect of the present disclosure involves receiving input signals; and modulating the received input signals using a non-rectangular octagonal QAM constellation comprising QAM symbols mapped to points in a non-rectangular octagonal grid that approximates an octagonal shape, the points in the non-rectangular octagonal grid having been selected from points in a uniform rectangular grid that comprises more grid points than the non-rectangular octagonal grid.

Yet another aspect of the present disclosure relates to an apparatus that includes an interface that receives input signals; and a QAM modulator, operatively coupled to the interface, that modulates the received input signals using a non-rectangular octagonal QAM constellation comprising QAM symbols mapped to points in a non-rectangular octagonal grid that approximates an octagonal shape, the points in the non-rectangular octagonal grid having been selected from points in a uniform rectangular grid that comprises more grid points than the non-rectangular octagonal grid.

Other aspects and features of embodiments will become apparent to those ordinarily skilled in the art upon review of the following description.

BRIEF DESCRIPTION OF THE DRAWINGS

Examples of embodiments will now be described in greater detail with reference to the accompanying drawings.

FIGS. 1A and 1B illustrate example 1024-QAM constellations.

FIG. 1C illustrates the example 1024-QAM constellation of FIG. 1B, with additional lines showing an octagonal shape approximated by the constellation.

DETAILED DESCRIPTION

Figure 2:
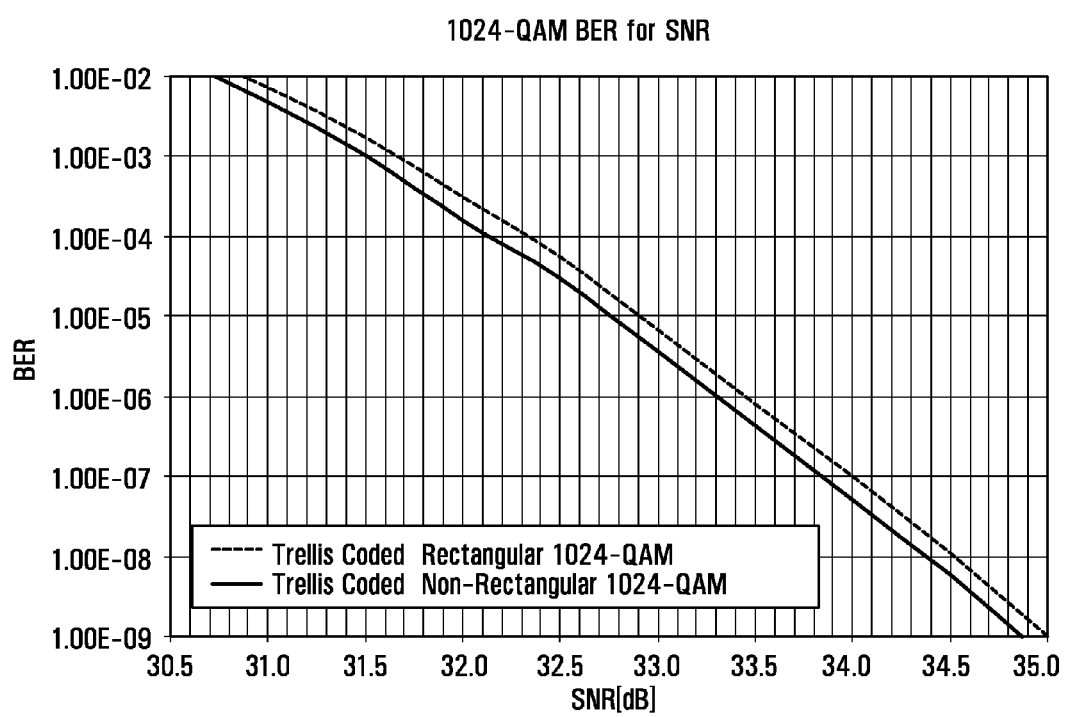
FIG. 2 includes plots of Bit Error Rate (BER) versus SNR for trellis coded rectangular 1024-QAM and trellis coded non-rectangular octagonal 1024-QAM.

According to conventional rectangular 1024-QAM, for example, 10-bit symbols are mapped into a 32-by-32 rectangular grid. In an embodiment disclosed herein, 10-bit symbols are mapped into a more efficient, approximately octagonal shape for 1024-QAM. This is shown in FIGS. 1A and 1B, which illustrate example 1024-QAM constellations.

The conventional rectangular 1024-QAM constellation in FIG. 1A is a rectangular 32-by-32 two-dimensional constellation. A different 10-bit QAM symbol is mapped to each point in a uniform rectangular grid to form the constellation. The non-rectangular octagonal 1024-QAM constellation in FIG. 1B is one example in accordance with the teachings provided herein. The example non-rectangular octagonal 1024-QAM constellation in FIG. 1B, like the rectangular constellation in FIG. 1A, includes 1024 10-bit symbols uniquely mapped to 1024 grid points. The vertical and horizontal spacing between adjacent symbol points in both constellations is also the same. However, the example non-rectangular octagonal constellation in FIG. 1B is a more efficient mapping. The distance from the origin of the rectangular constellation to the farthest symbol points (i.e., the points at the corners of the constellation) in FIG. 1A is greater than the maximum distance in the example non-rectangular octagonal constellation in FIG. 1B.

The example non-rectangular octagonal constellation shown in FIG. 1B approximates an octagonal shape, and therefore could be considered a form of octagonal constellation. References herein to octagonal constellations are intended to denote constellations that approximate an octagonal shape. A constellation need not define a perfect octagon. In the example octagonal constellation shown in FIG. 1B, straight lines passing through the outermost "corner" points that have only two nearest neighbor points in the constellation would define an octagon. Put another way, it is possible to define an octagon wherein these corner points lie along sides of the octagon. In this sense, the example octagonal constellation shown in FIG. 1B approximates an octagonal shape. This is shown in FIG. 1C, which illustrates the example 1024-QAM constellation of FIG. 1B, with additional lines showing an octagonal shape approximated by the constellation. The dashed lines in FIG. 1C are intended solely for illustrative purposes, and do not form part of the constellation.

It should be appreciated that the example non-rectangular octagonal constellation in FIG. 1B, and constellations according to other embodiments, are based on a uniform rectangular grid. As noted above, the spacing between adjacent symbol points in the rectangular constellation and the example non-rectangular octagonal constellation in FIG. 1B is the same. Non-rectangular grids, to which QAM symbols are mapped to form non-rectangular constellations as disclosed herein, are subsets of uniform rectangular grids. The example non-rectangular octagonal 1024-QAM constellation in FIG. 1B includes 1024 QAM symbols mapped to grid points selected from a larger uniform 36-by-36 rectangular grid as described below. Selection of points from a rectangular grid keeps the Euclidian distance calculation complexity low. The Euclidian distance between a received symbol and a transmitted signal is the noise energy. Being able to calculate the Euclidian distance between any point on the plane to a batch of grid points (rows and columns) is crucial for a simple and low complexity integration of the constellation and an error correction code.

Non-rectangular octagonal constellations as disclosed herein may involve a slightly more complex modulator and demodulator than those for rectangular QAM since grid points for the non-rectangular constellations are selected from slightly larger rectangular grids for the same modulation level or order. This increase in complexity represents a trade-off against gains in SNR and PAPR performance.

In one embodiment, a simulation that involved modulation using the example non-rectangular octagonal 1024-QAM constellation in FIG. 1B provided an SNR advantage of 0.19 dB over conventional rectangular 1024-QAM. This allows successful decoding of a modulated signal at an SNR of 0.19 dB worse than the minimal SNR required for conventional rectangular 1024-QAM. Actual performance could vary from these example simulation results.

Figure 3:
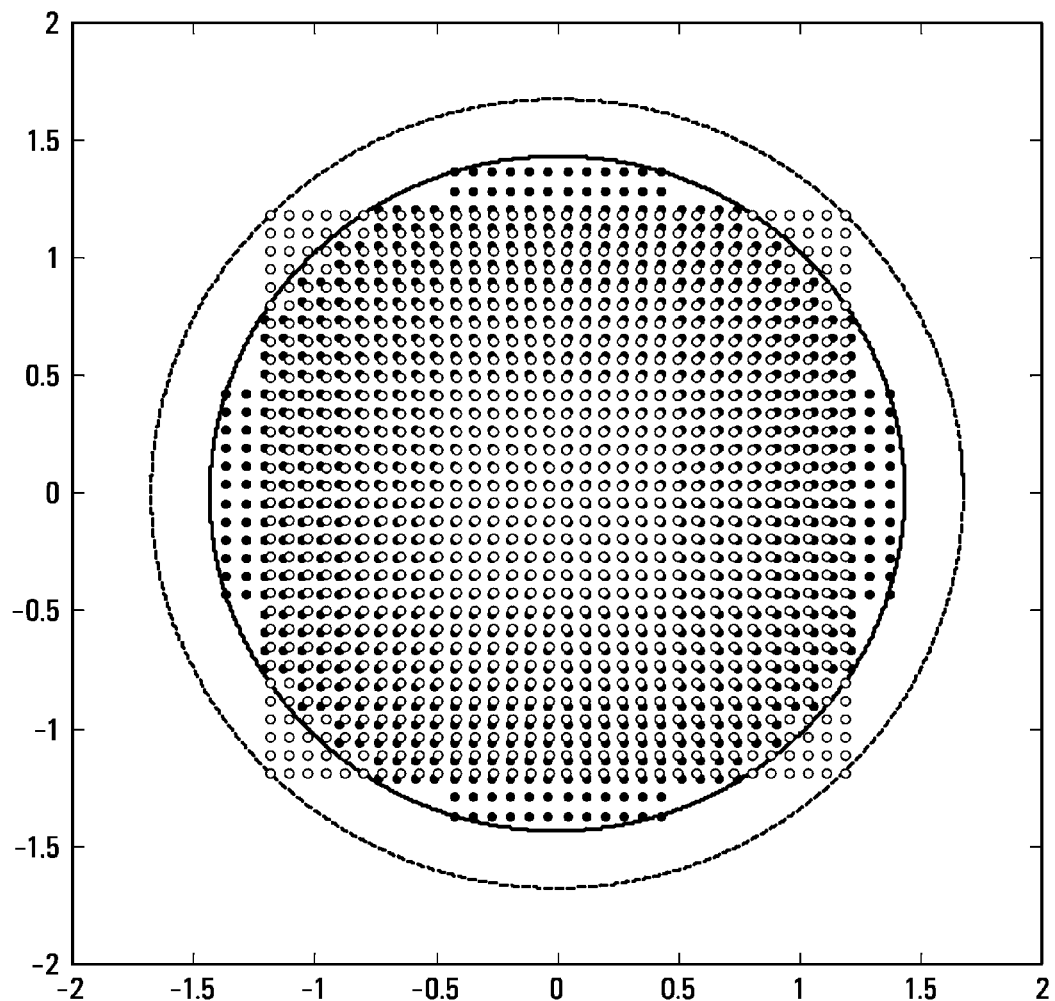
FIG. 3 illustrates example rectangular and non-rectangular octagonal 1024-QAM constellations, both with the same average power.

When the octagonal mapping is compared to a standard rectangular 1024-QAM with same average power, the grid spacing of the octagonal constellation is wider, as shown, for example in FIG. 3. If we denote the grid squared spacing of the rectangular 1024-QAM constellation as $d^2$, then the grid squared spacing of the octagonal 1024-QAM constellation will be $682/653*d^2$ and the expected performance gain will be $10*\log_{10}(682/653)=0.19$ dB. The expected theoretical performance gain was verified in a simulation to +/−0.02 dB certainty.

The "(682/653)" term above is based on average powers of octagonal and rectangular 1024-QAM constellations. For the examples in FIGS. 1A and 1B, for instance, the average powers are defined as:

$$P_{octagonal\_QAM1024} = \frac{1}{1024}\sum_{n=1}^{1024} I_n^2 + Q_n^2,$$

$(I_n, Q_n) \in$ [octagonal 1024$QAM$ grid]

and $$P_{QAM1024} = \frac{1}{1024}\sum_{n=1}^{1024} I_n^2 + Q_n^2,$$

$(I_n, Q_n) \in$ [rectangular 1024$QAM$ grid].

These values $P_{octagonal\_QAM\,1024}$ and $P_{Q\,1024}$ can be calculated to be:

$$P_{octagonal\_QAM1024} = \frac{1}{1024}((1^2+1^2)+(1^2+3^2)\ldots(35^2+11^2)) = \frac{668672}{1024} = 653,$$

and $$P_{QAM1024} = \frac{1}{1024}((1^2+1^2)+(1^2+3^2)\ldots(31^2+31^2)) = \frac{698368}{1024} = 682.$$

If we compare the two constellations at the same average power the square ratio of their respective grid spacings will be therefore 682/653.

A unique quality of non-rectangular octagonal QAM as disclosed herein is the ability to partition constellations into either 2 or 4 cosets. An example of such partitioning is discussed below. This quality ensures that the 0.19 dB SNR advantage can also be maintained when a modulated signal is combined with Forward Error Correction (FEC) coding. A non-rectangular octagonal constellation can be divided into 2 or 4 cosets of 512 or 256 points, respectively, with each coset being used to modulate 9-bit or 8-bit of information, respectively.

FIG. 2 includes plots of BER versus SNR for trellis coded rectangular 1024-QAM and trellis coded non-rectangular octagonal 1024-QAM. The plots in FIG. 2 illustrate that the SNR advantage of non-rectangular octagonal 1024-QAM is maintained even when the modulation is used in Trellis Coded Modulation (TCM). Since many modern communication devices use error correction codes, the successful integration of FEC coding, such as trellis coding techniques in TCM, with modulations can be a useful feature.

Embodiments of non-rectangular octagonal QAM as disclosed herein may also provide for a lower PAPR than convention rectangular QAM. In a simulation using the example non-rectangular octagonal 1024-QAM constellation shown in FIG. 1B, the example non-rectangular octagonal constellation exhibits a PAPR of 3.14 dB, compared to the 4.50 dB PAPR of conventional rectangular 1024-QAM. This provides a 1.36 dB advantage in transmitter output power. Actual performance may vary from the simulation results.

FIG. 3 illustrates example rectangular and non-rectangular 1024-QAM constellations, both with the same average power. The peak power of the example non-rectangular 1024-QAM (the inner circle) is 1.36 dB lower than the peak power of the conventional rectangular 1024-QAM (the outer circle). If a communication device is able to transmit at the peak power shown for the rectangular 1024-QAM, then transmitter output power for the non-rectangular octagonal 1024-QAM could potentially be increased to the same peak as for the rectangular 1024-QAM in this example, so that symbols are transmitted at 1.36 dB higher power.

According to teachings provided herein, constellation points for a non-rectangular octagonal constellation are selected from a uniform rectangular grid. In FIG. 3, however, the spacing between the non-rectangular octagonal 1024-QAM symbols is slightly wider than that of the rectangular 1024-QAM symbols. This different spacing is a result of normalizing the rectangular and the non-rectangular octagonal 1024-QAM constellations to the same average power. When the average power of the set of 1024 points in the rectangular 1024-QAM constellation is normalized to 1, the grid spacing of the non-rectangular octagonal constellation points will be different from the grid spacing in the rectangular constellation as a result of the 0.19 dB SNR advantage described above. This normalization accounts for the different grid spacings which are evident in FIG. 3.

Figure 4:
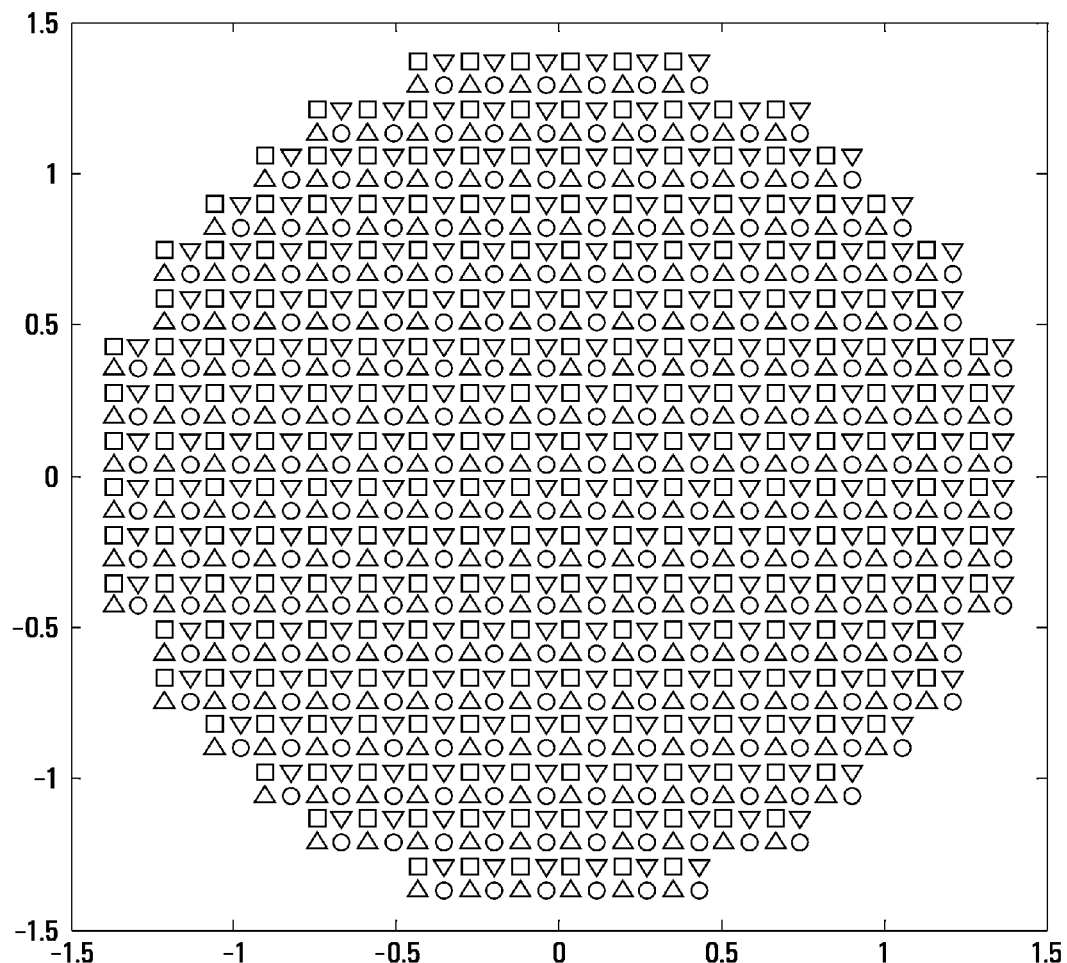
FIG. 4 illustrates an example non-rectangular octagonal 1024-QAM constellation symmetrically partitioned into four cosets.

As noted above, partitioning of a non-rectangular 1024-QAM constellation, into 4 different cosets for example, allows integration with FEC coding. FIG. 4 illustrates an example non-rectangular octagonal 1024-QAM constellation symmetrically partitioned into four cosets. Partitioning could be in accordance with techniques as described, for example, in Ungerboeck, G., "Channel Coding With Multilevel/Phase Signals", IEEE Transactions on Information Theory, Vol. 28, Issue 1, January 1982, pages 55-67. In FIG. 4, the cosets are designated with different shapes.

By subdividing the constellation points into cosets a strong coding scheme can be assigned to protect constellation points from their neighbors (inter-coset) and a weaker code can be assigned to protect them against other coset members (intra-coset). Ungerboeck was able to demonstrate that by focusing the coding overheads where they are needed, the same error rate can be achieved at a lower SNR.

Figure 5:
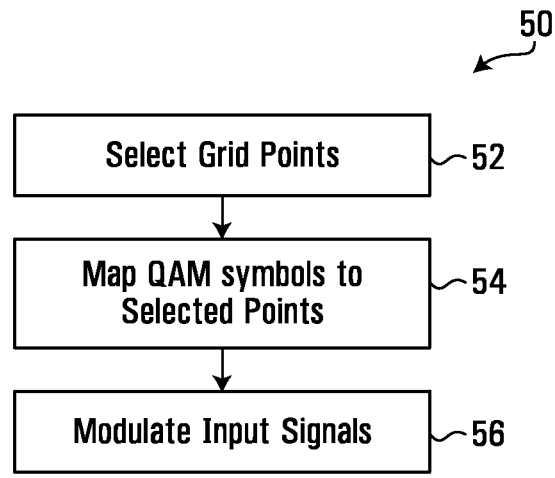
FIG. 5 is a flow diagram illustrating an example method.

FIG. 5 is a flow diagram illustrating an example method. The example method 50 includes an operation of selecting grid points as shown at 52. From a uniform rectangular grid, which includes points that have equal horizontal and vertical spacing, a subset of the points are selected to form a non-rectangular octagonal grid. As noted above, the non-rectangular octagonal grid approximates an octagonal shape. At 54, QAM symbols are mapped to respective grid points in the non-rectangular octagonal grid to form a non-rectangular octagonal QAM constellation that approximates the octagonal shape.

The non-rectangular QAM constellation could be used in modulating input signals, as shown at 56. Thus, at 56, received input signals are modulated using a non-rectangular octagonal QAM constellation that includes QAM symbols mapped (at 54) to points in a non-rectangular octagonal grid that approximates an octagonal shape, the points having been selected (at 52) from points in a uniform rectangular grid. In a TCM system, the input signals are trellis coded signals.

In general, if the non-rectangular octagonal grid comprises N points with N a positive integer power of 2 (i.e., $N=2^n$, $n \geq 1$), then those points would be selected from a rectangular grid that has more than N points. For example, the rectangular grid could be an M-by-M matrix of points, where M is a positive integer and $M^2 > N$. As discussed above with reference to FIG. 1, the grid points to which 10-bit 1024-QAM symbols are mapped in the example non-rectangular octagonal constellation are selected from a 36-by-36 grid. N=1024 and M=36 in this example.

For set partitioning, the non-rectangular QAM constellation includes symbols in different cosets. Supposing there are k cosets, with $k=2^K$ and $K \geq 1$ (i.e., k is a positive integer power of 2), the selecting at 52 involves selecting points from the rectangular grid in groups of k adjacent points, and the mapping at 54 involves mapping a QAM symbol from each of the k cosets to each group of k points. In the example shown in FIG. 4, k=4 and grid points are selected in groups of 4 to provide for symmetric set partitioning. One QAM symbol from each coset is then mapped to a grid point in each group of 4 points.

The selecting at 52 could be performed using an expanding circle. For selection of an M-point non-rectangular octagonal grid, points of the rectangular grid that fall within a circle centered at an origin of the rectangular grid could be selected. The selection circle is expanded until M points fall within the circle.

This type of selection technique could be applied in conjunction with set partitioning. In this case, for an N-point non-rectangular octagonal grid to which symbols for k cosets will be mapped, the selecting at 52 involves selecting points of the rectangular grid in groups of k adjacent points that fall within a circle centered at an origin of the rectangular grid and expanding the circle until N/k groups of k points fall within the circle. Group selection of grid points could result in more than N grid points falling inside the selection circle, where only some of the points from one or more k-point groups fall within the selection circle. However, only selected points (i.e., the points in selected groups) would have QAM symbols mapped to them at 54, so that a desired constellation size is not exceeded.

Figure 6:
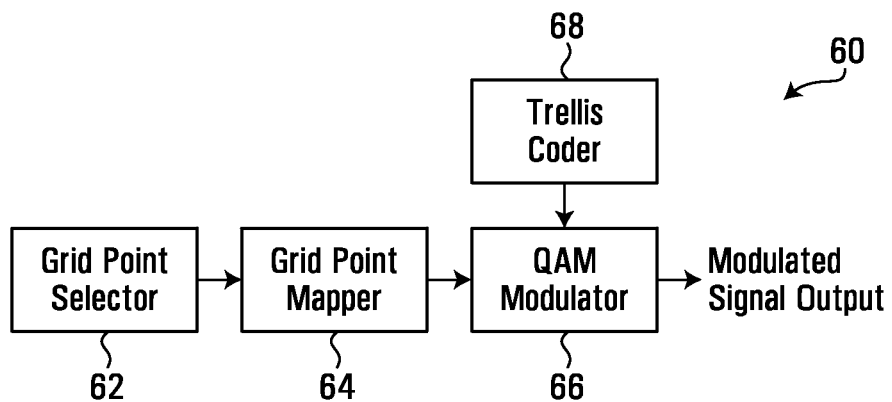
FIG. 6 is a block diagram illustrating an example apparatus.

FIG. 6 is a block diagram illustrating an example apparatus. The example apparatus 60 includes a grid point selector 62, a grid point mapper 64, and a QAM modulator 66. A trellis coder 68 is also shown, to illustrate an apparatus that might be used in a TCM system. It should be appreciated that the apparatus of FIG. 6, as well as the contents of the other drawings, are intended solely for illustrative purposes, and that embodiments of the present disclosure are in no way limited to the particular examples explicitly shown in the drawings and described herein. Other embodiments could include fewer, additional, and/or different components than those shown in FIG. 6, for example. A trellis coder 68, for instance, might not be used to encode input signals prior to modulation in all embodiments. Other embodiments could employ other forms of FEC encoders, or no encoding prior to modulation. A modulated signal output provided by the modulator 66 could be provided to other components, such as a transmitter, which has not been specifically shown in order to avoid congestion in the drawing and in light of the broad range of communication devices in which modulation as disclosed herein could be implemented.

The interconnections shown in FIG. 6 may take any of various forms. For example, components could be interconnected through cables or other types of physical conductors, wireless links, shared memory locations that are accessed by different components, and/or software variables or registers that are used by different components. Other types of connections could be used in other embodiments, and may be implementation-dependent.

The grid point selector 62, the grid point mapper 64, the QAM modulator 66, and the trellis coder 68 are implemented using hardware and/or firmware, and could include one or more components that execute software. For example, a microprocessor could be used to execute software, stored in a memory (not shown), and implement any or all of the components shown in FIG. 6. The same memory device(s), or one or more different memory device(s), could be used to store information representing rectangular grids, non-rectangular octagonal grids, QAM symbols, and/or other information that is used in preparing constellations or modulating signals using those constellations. Solid state memory devices and/or memory devices that have movable or even removable storage media could be used for these purposes.

Various forms of trellis coders and QAM modulators could be used to implement the example apparatus 60, and implementations may vary depending on communication devices in which these components are to be provided. Similarly, any of various forms of grid point selectors and mappers could be used in different embodiments. The present disclosure relates primarily to a particular shape of QAM constellation, which could be generated and used by a QAM modulator that, in structure, is conventional. In accordance with the teachings provided herein, any of various conventional QAM modulators could be configured to use non-rectangular octagonal QAM constellations, which approximate an octagonal shape, instead of other constellations.

The grid point selector 62 selects, from a uniform rectangular grid including points that have equal horizontal and vertical spacing, a subset of the points to form a non-rectangular octagonal grid. The non-rectangular octagonal grid approximates an octagonal shape. The grid point mapper 64 is operatively coupled to the grid point selector and maps QAM symbols to respective grid points in the non-rectangular octagonal grid to form a non-rectangular octagonal QAM constellation. The QAM modulator 66, which is operatively coupled to the grid point mapper 64, modulates input signals using the non-rectangular octagonal QAM constellation.

Thus, the QAM modulator 66 receives input signals through an interface, which could be a connection to an input or some other form of interface, and modulates the received input signals using a non-rectangular octagonal QAM constellation that includes QAM symbols mapped to points in a non-rectangular octagonal grid that approximates an octagonal shape. These points would have been selected from points in a uniform rectangular grid by the grid point selector 62, and the QAM symbol mapping would have been performed by the grid point mapper 64. In a TCM system, the trellis coder 68 is operatively coupled to the QAM modulator 66 and generates trellis coded signals as the input signals for modulation.

The example apparatus 60 is intended solely for illustrative purposes, and other embodiments may involve variations of this example. For instance, variations may be or become apparent on the basis of FIG. 5 and the description thereof. Any or all of the functions disclosed herein in the context of a method may similarly be embodied in an apparatus.

Figure 7:
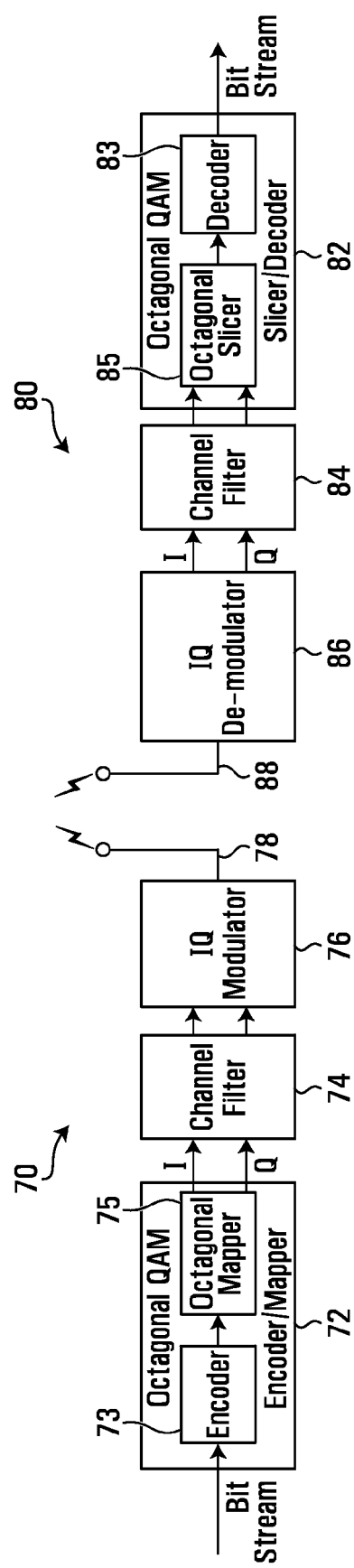
FIG. 7 is a block diagram illustrating an example transmitter and receiver.

FIG. 7 is a block diagram illustrating an example transmitter and receiver. The example transmitter 70 includes an octagonal QAM encoder/mapper 72, a channel filter 74, an IQ modulator 76, and an antenna 78 operatively coupled together as shown. The QAM encoder/mapper 72 in this example includes an encoder 73 and an octagonal mapper 75 operatively coupled to the encoder. The example receiver 80 similarly includes an octagonal QAM slicer/decoder 82 that includes a decoder 83 and an octagonal slicer 85, a channel filter 84, an IQ demodulator 86, and an antenna 88 operatively coupled together as shown.

The actual implementation of the example transmitter 70 and receiver 80 could use conventional components. In accordance with the teachings provided herein, however, such components use non-rectangular octagonal constellations in the octagonal QAM encoder/mapper 72 and the octagonal QAM slicer/decoder 82. The components used in implementing the example transmitter 70 and receiver 80 might include hardware, firmware, and/or processing elements or components that execute software stored in one or more memory devices (not shown).

In operation, the octagonal QAM encoder/mapper 72 receives input signals, in the form of a bit stream in the example shown. The encoder 73 encodes the input bit stream using a FEC code in one embodiment, and provides an encoded bit stream to the octagonal mapper 75. The octagonal mapper 75 maps the encoded bit stream input onto an I/Q baseband signal using an octagonal QAM constellation, the modulated signal goes through the channel filter 74 and the modulator 76, that modulates a carrier with the baseband signal so it can be transmitted through the antenna 78. It should be noted that mapping by the octagonal mapper 75 uses a QAM constellation, whereas mapping by the grid point mapper 64 (FIG. 6) refers to grid point mapping where QAM symbols are mapped to selected grid points of a uniform rectangular grid to form an octagonal QAM constellation. The grid point mapper 64 builds the QAM constellation, and the octagonal mapper 75 uses that constellation to modulate signals.

At the example receiver 80, signals received by the antenna 88 are ideally the same as the signals transmitted by the transmitter 78. However, a wireless link, or more generally any communication link, is affected by some level of noise and distortion. The IQ demodulator 86 demodulates a received signal from the carrier frequency to a baseband signal, which is then filtered in the channel matched filter 84 and fed into the octagonal-QAM slicer/decoder 82. The I/Q baseband signal is demapped by the octagonal slicer 85 using the same octagonal QAM constellation as the octagonal mapper 75, and decoded by the decoder 83. In one embodiment, the decoder 83 is a FEC decoder. The output bit stream from the decoder 83 should ideally match the input bit stream received at 72. Any bit discrepancy between the input bit stream and the output bit stream is by definition a bit error.

When compared to conventional rectangular QAM, the QAM techniques disclosed herein may offer an improved PAPR and operate at a lower SNR with an equal or better BER.

Disclosed embodiments may also be specifically optimized to operate in conjunction with FEC codes, allowing Ungerboeck set partitioning to k cosets (e.g., k=2 or k=4).

What has been described is merely illustrative of the application of principles of embodiments of the invention. Other arrangements and methods can be implemented by those skilled in the art without departing from the scope of the present invention.

For example, an illustrative example discussed in detail above relates to 1024-QAM. It should be appreciated, however, that the techniques disclosed herein could be applied to other levels or orders of modulation, including 128-QAM, 256-QAM, 512-QAM, 2048-QAM, etc. These techniques could also or instead be applied to lower modulation levels or orders below 128-QAM.

The divisions of functions as shown in FIGS. 6 and 7 are similarly intended solely for illustrative purposes. Embodiments may be implemented with fewer, additional, and/or different components than those explicitly shown.

In addition, although described primarily in the context of methods and systems, other implementations are also contemplated, as instructions stored on a non-transitory computer readable medium, for example.

We claim:

1. A method comprising:
selecting, by a grid point selector, from a uniform rectangular grid comprising points that have equal horizontal and vertical spacing, a subset of the points to form a non-rectangular octagonal grid, the non-rectangular octagonal grid approximating an octagonal shape; and
mapping, by a grid point mapper, Quadrature Amplitude Modulation (QAM) symbols to respective grid points in the non-rectangular octagonal grid to form a non-rectangular octagonal QAM constellation that approximates the octagonal shape.

2. The method of claim 1,
the non-rectangular octagonal grid comprising N points, $N=2^n$, $n \geq 1$,
the rectangular grid comprising an M-by-M matrix of points, M a positive integer and $M^2 > N$.

3. The method of claim 1,
the non-rectangular octagonal QAM constellation comprising symbols in k cosets, $k=2^K$, $K \geq 1$,
the selecting comprising selecting points from the rectangular grid in groups of k adjacent points,
the mapping comprising mapping a QAM symbol from each of the k cosets to each group of k points.

4. The method of claim 1,
the non-rectangular octagonal grid comprising N points, $N=2^n$, $n \geq 1$,
the selecting comprising selecting points of the rectangular grid that fall within a circle centered at an origin of the rectangular grid and expanding the circle until N points fall within the circle.

5. The method of claim 3,
the non-rectangular octagonal grid comprising N points, $N=2^n$, $n \geq 1$,
the selecting comprising selecting points of the rectangular grid in groups of k adjacent points that fall within a circle centered at an origin of the rectangular grid and expanding the circle until N/k groups of k points fall within the circle.

6. The method of claim 1, further comprising:
modulating input signals using the non-rectangular octagonal QAM constellation.

7. The method of claim 6, the input signals comprising trellis coded input signals.

8. A non-transitory computer readable medium storing instructions which when executed cause the method of claim 1 to be performed.

9. An apparatus comprising:
a grid point selector that selects, from a uniform rectangular grid comprising points that have equal horizontal and vertical spacing, a subset of the points to form a non-rectangular octagonal grid, the non-rectangular octagonal grid approximating an octagonal shape; and
a grid point mapper that maps Quadrature Amplitude Modulation (QAM) symbols to respective grid points in the non-rectangular octagonal grid to form a non-rectangular octagonal QAM constellation.

10. The apparatus of claim 9,
the non-rectangular octagonal grid comprising N points, $N=2^n$, $n \geq 1$,
the rectangular grid comprising an M-by-M matrix of points, M a positive integer and $M^2 > N$.

11. The apparatus of claim 9,
the non-rectangular octagonal QAM constellation comprising symbols in k cosets, $k=2^K$, $K \geq 1$,
the grid point selector selecting points from the rectangular grid in groups of k adjacent points,
the grid point mapper mapping a QAM symbol from each of the k cosets to each group of k points.

12. The apparatus of claim 9,
the non-rectangular octagonal grid comprising N points, $N=2^n$, $n \geq 1$,
the grid point selector selecting points of the rectangular grid that fall within a circle centered at an origin of the rectangular grid and expanding the circle until N points fall within the circle.

13. The apparatus of claim 11,
the non-rectangular octagonal grid comprising N points, $N=2^n$, $n \geq 1$,
the grid point selector selecting points of the rectangular grid in groups of k adjacent points that fall within a circle centered at an origin of the rectangular grid and expanding the circle until N/k groups of k points fall within the circle.

14. The apparatus of claim 9, further comprising:
a modulator, operatively coupled to the grid point mapper, that modulates input signals using the non-rectangular octagonal QAM constellation.

15. The apparatus of claim 14, further comprising:
a trellis coder operatively coupled to the modulator, that generates trellis coded signals as the input signals.

16. A method comprising:
receiving, by an interface, input signals;
modulating the received input signals, by a Quadrature Amplitude Modulation (QAM) modulator operatively coupled to the interface, using a non-rectangular octagonal QAM constellation comprising QAM symbols mapped to points in a non-rectangular octagonal grid that approximates an octagonal shape, the points in the non-rectangular octagonal grid having been selected from points in a uniform rectangular grid that comprises more grid points than the non-rectangular octagonal grid.

17. An apparatus comprising:

an interface that receives input signals;

a Quadrature Amplitude Modulation (QAM) modulator, operatively coupled to the interface, that modulates the received input signals using a non-rectangular octagonal QAM constellation comprising QAM symbols mapped to points in a non-rectangular octagonal grid that approximates an octagonal shape, the points in the non-rectangular octagonal grid having been selected from points in a uniform rectangular grid that comprises more grid points than the non-rectangular octagonal grid.

\* \* \* \* \*